(12) United States Patent
Wehrs

(10) Patent No.: US 7,521,944 B2
(45) Date of Patent: Apr. 21, 2009

(54) SYSTEM AND METHOD FOR DETECTING FLUID IN TERMINAL BLOCK AREA OF FIELD DEVICE

(75) Inventor: David L. Wehrs, Eden Prairie, MN (US)

(73) Assignee: Rosemount Inc., Eden Prairie, MN (US)

( * ) Notice: Subject to any disclaimer, the term of this patent is extended or adjusted under 35 U.S.C. 154(b) by 193 days.

(21) Appl. No.: 11/648,198

(22) Filed: Dec. 28, 2006

(65) Prior Publication Data

US 2008/0156090 A1 Jul. 3, 2008

(51) Int. Cl.
*G01R 27/08* (2006.01)
*G01F 23/00* (2006.01)

(52) U.S. Cl. ............... 324/694; 324/691; 73/290 R

(58) Field of Classification Search ................ None
See application file for complete search history.

(56) References Cited

U.S. PATENT DOCUMENTS

| | | | |
|---|---|---|---|
| 4,382,382 A | 5/1983 | Wang | |
| 4,480,251 A * | 10/1984 | McNaughton et al. | ...... 340/604 |
| 4,947,104 A * | 8/1990 | Pyke | .......... 324/71.5 |
| 5,083,091 A | 1/1992 | Frick et al. | |
| 5,481,200 A | 1/1996 | Voegele et al. | |
| 5,546,009 A * | 8/1996 | Raphael | ..... 324/694 |
| 2004/0095154 A1 * | 5/2004 | Lundstrom et al. | ..... 324/694 |
| 2005/0046584 A1 | 3/2005 | Breed | |
| 2005/0087620 A1 * | 4/2005 | Bowers et al. | ........ 239/63 |
| 2005/0247330 A1 * | 11/2005 | Land et al. | ......... 134/113 |
| 2005/0289276 A1 | 12/2005 | Karschnia et al. | |

* cited by examiner

*Primary Examiner*—Vincent Q Nguyen
*Assistant Examiner*—Jeff Natalini
(74) *Attorney, Agent, or Firm*—Kinney & Lange, P.A.

(57) ABSTRACT

A field device detects the presence of fluid in the terminal block area of the field device by generating an alternating current (AC) test current signal and measuring the amplitude of the resulting AC voltage signal. The field device includes a first terminal and a second terminal adapted for connection to a control room through a twisted-wire pair current loop. Impedance of the current loop is increased by the presence of fluid between the first terminal and the second terminal. By providing an AC test current signal to the control loop and measuring a resulting AC voltage magnitude, the impedance of the control loop can be determined. Increased impedance in the control loop indicates the presence of water in the terminal block.

21 Claims, 6 Drawing Sheets

SYSTEM AND METHOD FOR DETECTING FLUID IN TERMINAL BLOCK AREA OF FIELD DEVICE

BACKGROUND OF THE INVENTION

The present invention relates to monitoring the condition of field devices. Specifically, the invention relates to a system for detecting the presence of fluids in the field devices.

In many industrial settings, control systems are used to monitor and control inventories, processes, and the like. A typical control system includes a centralized control room and a number of field devices geographically removed from the control room. The field devices communicate process data to the control room using either analog or digital communication means.

Traditionally, analog field devices have been connected to the control room by two-wire twisted-pair current loops, with each field device connected to the control room by a single two-wire twisted pair loop. Located within the field device housing are terminals for connecting the twisted-pair current loops to circuitry within the field device. This region is referred to as the terminal block area of the field device. Typically, a voltage differential is maintained between the two wires of approximately 20 to 25 volts, and a current between 4 and 20 milliamps (mA) runs through the loop. An analog field device transmits a signal to the control room by modulating the current running through the current loop to a current proportional to the sensed process variable. A receiving device measures the voltage across a load resistor, typically located in the control room, in order to determine the magnitude of the modulated current.

While historically field devices were capable of performing only one function, recently, hybrid systems that superimpose digital data on the current loop have been used in distributed control systems. The Highway Addressable Remote Transducer (HART) and the Instrument Society of America (ISA) Fieldbus SP50 standards superimpose a digital carrier signal on the current loop signal. The HART standard employs frequency-shift keying (FSK) to transmit digital data over the current loop, and operates at frequencies of 1200 and 2400 baud. Other common protocols for communication of digital information over the current loop are Foundation Fieldbus, Profibus, and DeviceNet. Typically, these systems operate at much higher frequencies than the HART protocol. The digital carrier signal can be used to send secondary and diagnostic information. Examples of information provided over the carrier signal include secondary process variables, diagnostic information (such as sensor diagnostics, device diagnostics, wiring diagnostics, process diagnostics, and the like), operating temperatures, sensor temperature, calibration data, device ID numbers, configuration information, and so on. Accordingly, a single field device may have a variety of input and output variables and may implement a variety of functions.

Field devices are often located in physically challenging environments, with one potential problem being the collection of fluid within the terminal block area of the field device. The presence of fluid within the terminal block area can have a corrosive effect on the terminals and wires located within the terminal block area, ultimately causing the field device to fail. It is difficult and time-consuming, however, to periodically inspect each field device. Therefore, it would be beneficial to design a system for automatically detecting the presence of fluids with the terminal block area of field devices.

BRIEF SUMMARY OF THE INVENTION

The present invention provides a system and method for detection of fluids within the terminal block area of a field device. An AC test signal is generated on the current loop, and a resulting AC voltage magnitude is measured. The change in impedance caused by the presence of fluid between terminals of the field device can be detected based on the measured AC voltage magnitude.

DETAILED DESCRIPTION

Figure 1:
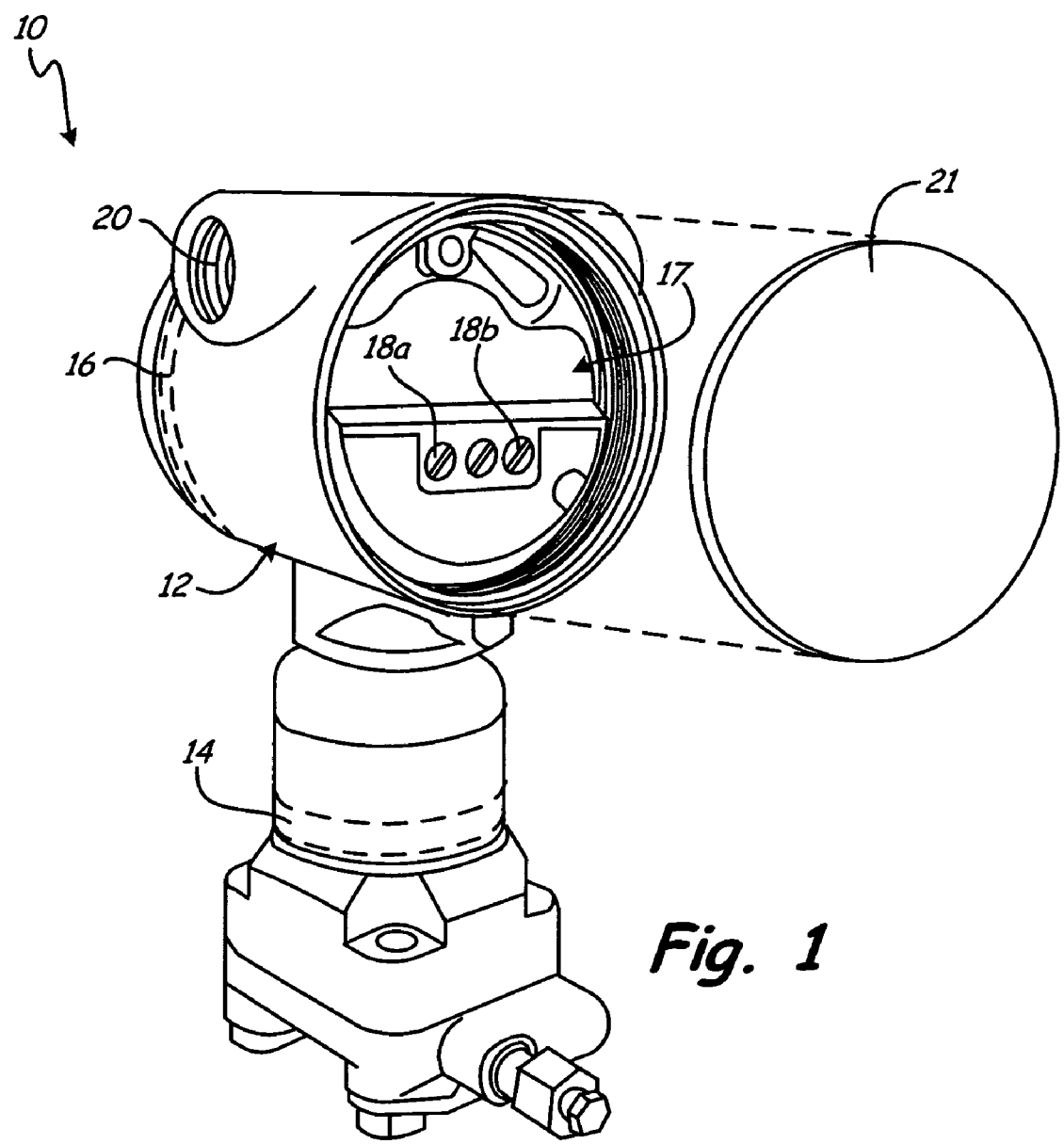
FIG. 1 is a perspective view of a field device opened to illustrate the location of terminals.

FIG. 1 illustrates field device 10, which includes housing 12, sensor board 14, circuit board 16, and terminal block 17 (which includes at least two terminals labeled 18a and 18b). Sensor board 14 measures a process variable (e.g. pressure, temperature, flow, etc.) and converts the measured process variable to an electronic signal. Circuit board 16 converts the signal provided by sensor board 14 to a signal that can be communicated to a control room, using either the traditional 4-20 mA analog communication technique, or some form of digital communication protocol (e.g., HART). Wiring from the control room enters field device 10 through field conduit port 20, and is connected to terminals 18a and 18b within terminal block 17.

Terminal block 17 includes threads that allow a cover 21 to be placed over terminal block 17. Ideally, housing 12 and cover 21 act to protect terminals 18a and 18b from environmental factors, such as fluid accumulation in terminal block 17. Despite these efforts, fluids may infiltrate and accumulate within terminal block 17. The presence of fluid in terminal block 17 may have a corrosive effect on terminals 18a and 18b. Corrosion on terminals 18a and 18b can adversely affect communication between field device 10 and a control room (shown in FIG. 4). Therefore, the ability to detect fluid within terminal block 17 would be very beneficial.

Figure 2:
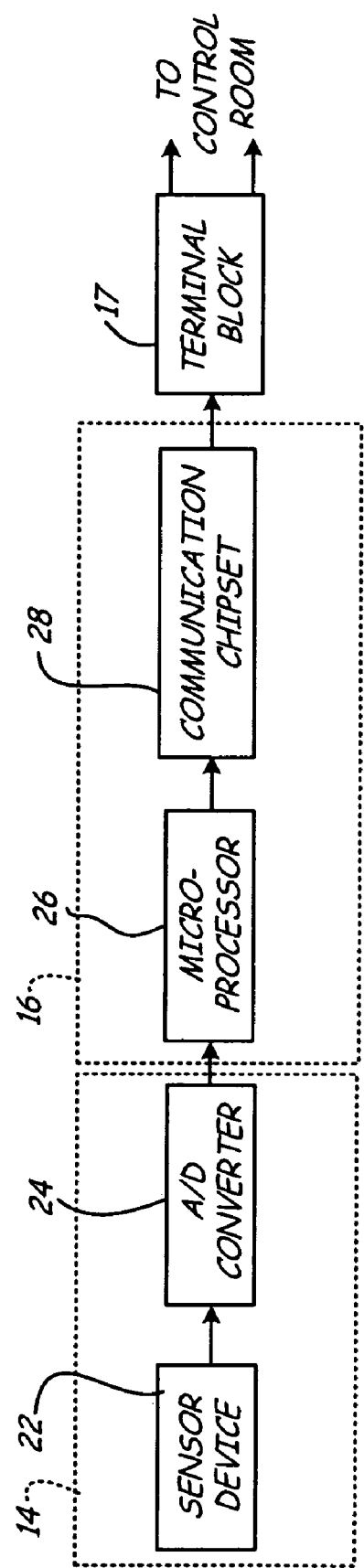
FIG. 2 is a functional block diagram of the components located within the field device.

FIG. 2 is a functional block diagram that illustrates how a monitored process variable is processed within field device 10 before being communicated to the control room. As shown in FIG. 2, sensor board 14 includes sensor device 22 and analog-to-digital converter 24, and circuit board 16 includes microprocessor 26 and communication chipset 28. Sensor device 22 measures a process variable, such as pressure or temperature, and converts the measured process variable to an analog signal. Sensor device 22 provides the analog signal representing the sensed process variable to A/D converter 24, which converts the analog signal to a digital signal that is provided to microprocessor 26. Microprocessor 26 (also referred to as a microcontroller) refers broadly to a device capable of performing calculations and communicating with other components. Microprocessor 26 may include a memory device for storing input provided by connected devices. At the request of microprocessor 26, communication chipset 28 converts a signal received from microprocessor 26 to a signal that can be communicated to the control room.

Communication chipset 28 communicates with the control room, in one embodiment, by regulating current provided between terminals 18a and 18b between 4-20mA, wherein the magnitude of the current provided by communication chipset 28 represents the magnitude of the sensed process variable. In addition, communication chipset 28 may communicate with the control room by superimposing a digital signal over the standard 4-20 mA signal (i.e., using a protocol known as the HART protocol). In yet another embodiment, communication chipset 28 may communicate all data digitally using other digital communication protocols such as Foundation Fieldbus or Profibus.

Figure 3:
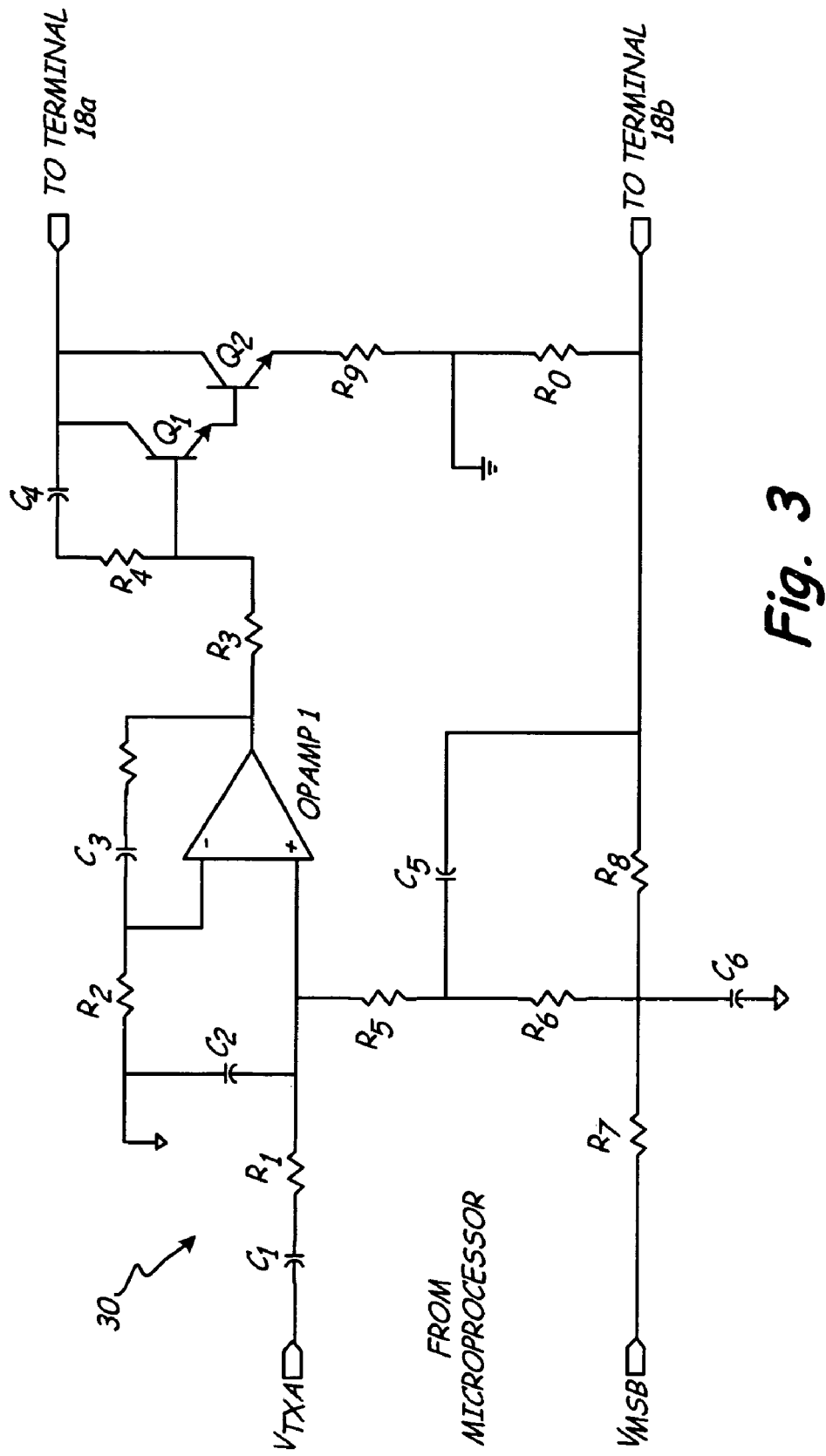
FIG. 3 is a circuit diagram of a current regulator circuit employed by the field device.

FIG. 3 is a circuit diagram illustrating an embodiment of current regulator circuit 30, located within communication chipset 28 (shown in FIG. 2), that converts input provided by microprocessor 26 (also shown in FIG. 2) to either an analog signal that is provided to the control room using the 4-20 mA loop current or a digital signal. Current regulator circuit 30 includes input terminal $V_{TXA}$ and input terminals $V_{MSB}$, capacitors C1, C2, C3, C4 and C5, resistors R0 (also referred to as current regulator resistor R0), R1, R2, R3, R4, R5, R6, R7, R8, and R9, operational amplifier OpAmp1, transistors Q1 and Q2, and output terminals that connect to terminals 18a and 18b. Input is provided by microprocessor 26 at input terminals $V_{TXA}$ and $V_{MSB}$, and output is provided to the control room via output terminals 18a and 18b.

Current regulator circuit 30 regulates the current generated through resistor R0 based on the inputs received at input terminals $V_{TXA}$ and $V_{MSB}$. The signal provided by microprocessor 26 to input terminal $V_{MSB}$ represents the sensed process variable, and the magnitude of the signal provided to input terminal $V_{MSB}$ dictates the magnitude of the 4-20 mA current provided through resistor R0. That is, current regulation circuit 30 varies the current provided through resistor R0 between 4 mA and 20 mA based on the signal provided at input terminal $V_{MSB}$.

In addition to the 4-20 mA analog current regulation provided by current regulator circuit 30 based on an input representative of the sensed process variable, current regulator circuit 30 may also regulate the current through resistor R0 to communicate a digital signal to the control room. In this example, the digital signal is provided to current regulation circuit by microprocessor 26 at terminal $V_{TXA}$.

In one embodiment, the digital signal is communicated to the control room using the HART communication protocol. This protocol employs frequency-shift keying (FSK) to transmit digital data over the current loop. In HART communications, the input provided at $V_{TXA}$ modulates the 4-20 mA current approximately ±0.5 mA at either 1200 Hertz (Hz) or 2400 Hz. Modulating the current at 1200 Hz represents a low or "0" digital signal, and modulating the current at 2400 Hz represents a high or "1" digital signal. In another embodiment, instead of analog communication using a 4-20 mA current regulation, field device 10 communicates digitally with the control room using a protocol known as Foundation Fieldbus. Much of this disclosure describes an embodiment in which field device 10 communicates with the control room via a standard 4-20 mA analog signal, although the present invention is applicable to embodiments that employ digital communication as well. As described in more detail with respect to FIG. 4 below, the present invention makes use of the digital communication capabilities of field device 10 to detect the presence of fluid in the terminal block.

Figure 4:
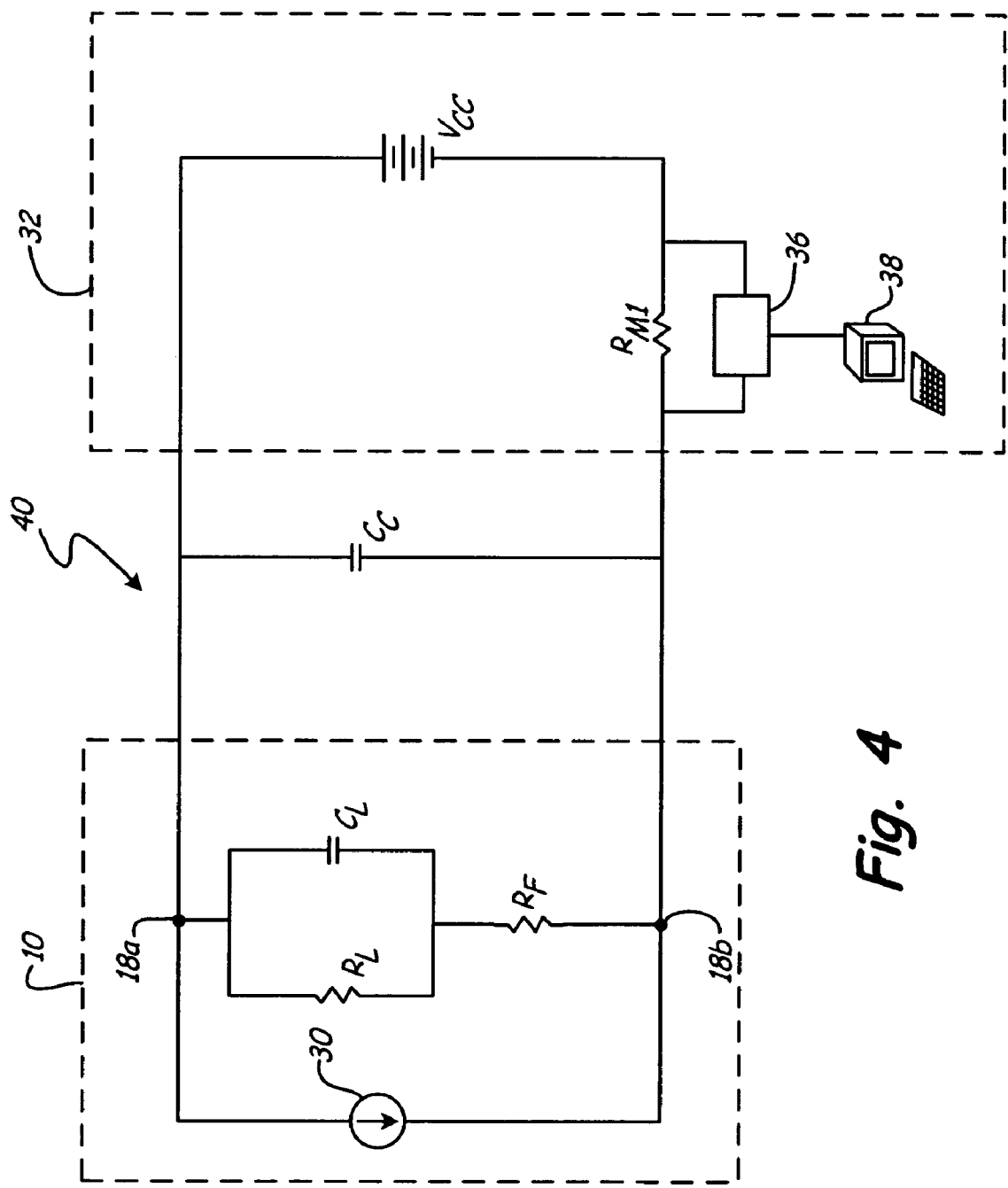
FIG. 4 is a circuit diagram illustrating a field device connected to a control room by a current loop with the presence of terminal leakage.

FIG. 4 is a circuit diagram illustrating the connection of field device 10 to monitoring station or control room 32. For purposes of this circuit diagram, only the elements responsible for communicating with control room 32 are shown. Therefore, field device 10 is represented by current regulation circuit 30 (modeled here as an ideal current source), and terminals 18a and 18b. Control room 32 is modeled here as including a DC power supply $V_{CC}$, measuring resistor $R_{M1}$, measuring device 36, and display unit 38. Field device 10 is connected to control room 32 by twisted cable or wire pair 40. Capacitor $C_C$ represents the capacitance created by twisted wire pairs 40.

For analog communication with field device 10, DC power supply $V_{CC}$ maintains a voltage differential between the two wires of approximately 20 to 25 volts, and a current between 4 and 20 milliamps (mA) runs through the current loop. Current regulator circuit 30 regulates the amplitude of the current provided to terminals 18a and 18b to a value proportional to the sensed process variable. The magnitude of the current provided by current regulator circuit 30 to terminals 18a and 18b is approximately equal to the magnitude of the current provided to control room 32 by twisted wire pair 40. Receiving device 36 is DC coupled to measure the resulting voltage across a measuring resistor $R_{M1}$. The measured voltage indicates the amplitude of the current provided by field device 10 and therefore the value of the measured process variable.

For digital communication between field device 10 and control room 32, current regulation circuit 30 superimposes a digital signal on the current loop. For example, as discussed above with respect to FIG. 3, the HART digital communication protocol modulates the 4-20 mA current approximately ±0.5 mA at either 1200 Hertz (Hz) or 2400 Hz to represent digital signals. For digital communication, measuring device 36 would also be AC coupled to receive digital information transmitted by field device 10. That is, the current modulation of ±0.5 mA (used in HART applications) is detected by measuring device 36, which measures the resulting AC voltage magnitude across resistor $R_{M1}$. In other embodiments, a hand-held measuring device is connected across terminals 18a and 18b to receive digital information transmitted by field device 10.

The presence of fluid between terminals 18a and 18b can be modeled by a leakage resistor $R_L$, leakage capacitor $C_L$, and fluid resistor $R_F$. Leakage resistor $R_L$ and leakage capacitor $C_L$ model the interface between a fluid and a terminal, and are typically large. For example, leakage resistor $R_L$ may have a value of approximately one megohm (MΩ), while leakage capacitor may have a value of approximately one microfarad (μF). Fluid resistance varies depending on the fluid, but is typically lower than the leakage resistance (for example, one kilohm (kΩ)). The large leakage resistance and leakage capacitance result in DC signals being relatively unaffected by the presence of fluid in terminal block area 17. However, the overall impedance (i.e., the combination of resistance and capacitance) created by the presence of fluid between terminals 18a and 18b can be detected using the AC signal generated by current regulation circuit 30 for digital communication.

For example, if field device 10 communicates using the HART standard, then current regulation circuit 30 generates a ±0.5 mA AC test current at either 1200 Hz or 2400 Hz. For the situation in which no fluid is present within terminal block area 12 (i.e., no terminal leakage), the leakage resistor $R_L$, leakage capacitor $C_L$ and fluid resistor $R_f$ are removed from the circuit. If cable capacitance $C_C$ is not taken into account, then a ±0.5 mA AC test current generated at 2400 Hz by current regulation circuit 30 results in ±125 mV signal being generated across measurement resistor $R_{M1}$ (assuming resistor $R_{M1}$ has a value of approximately 250 ohms). If cable capacitance $C_C$ is taken into account, a ±0.5 mA AC test current generated by field device 10 at 2400 Hz results in the amplitude of the AC voltage signal generated across the measurement resistor $R_{M1}$, being reduced to approximately ±117 mV.

If there is fluid present in terminal block area 17, then leakage resistor RL, leakage capacitance $C_L$, and fluid resistance $R_F$ are connected between terminals 18a and 18b as shown in FIG. 4. With the change in impedance caused by fluid in terminal block area 17, a ±0.5 mA AC test current generated by current regulation circuit 30 at 2400 Hz results in the magnitude of the AC voltage signal generated across the measurement resistor $R_{M1}$ being reduced to approximately ±90 mV. Thus, the change in impedance caused by the presence of fluid in terminal block area 17 results in a detectable decrease in the AC voltage magnitude measured across measurement resistor $R_{M1}$. This detectable decrease in the magnitude of the AC voltage signal allows the present invention to determine whether there is fluid present in terminal block area 17 of field device 10.

Figure 5:
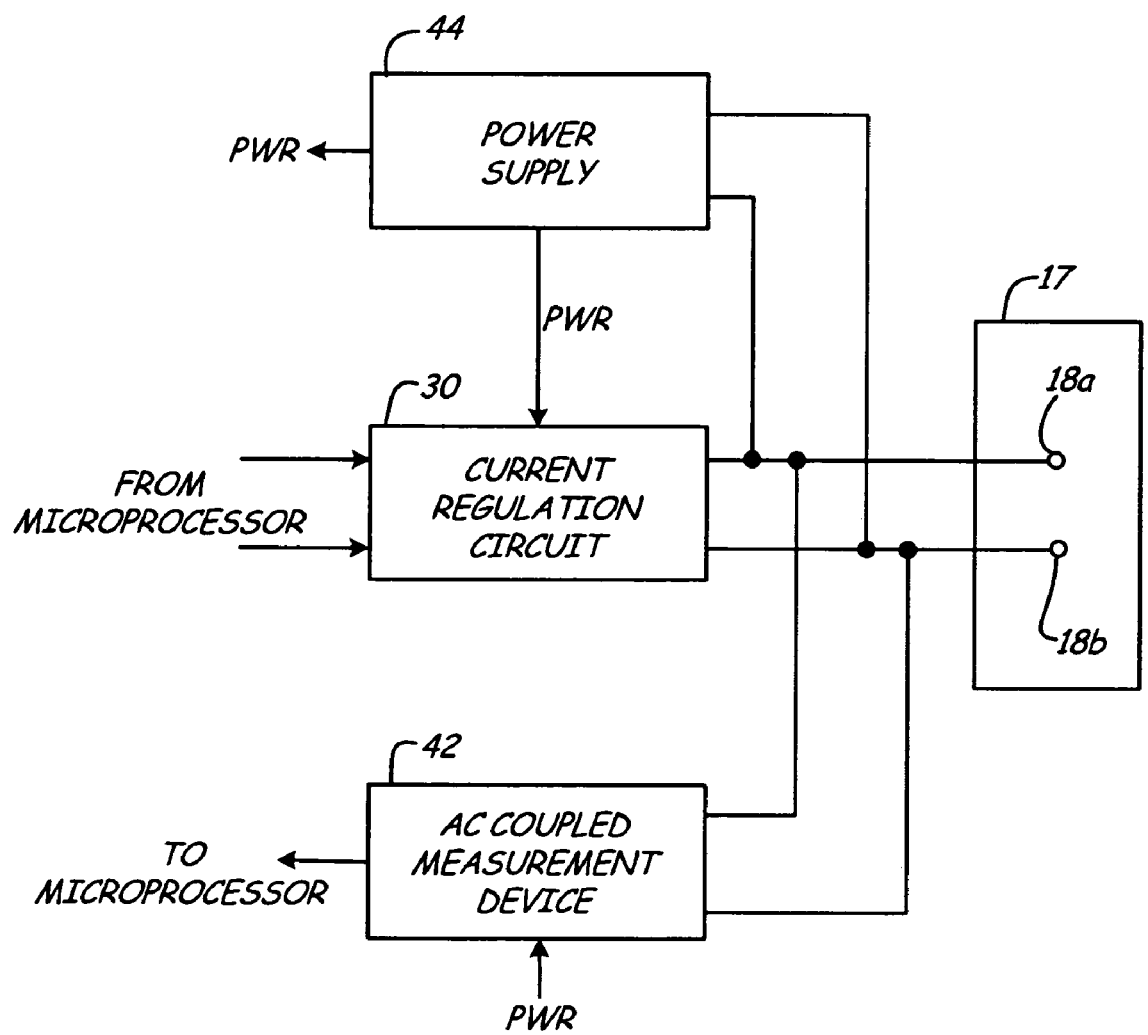
FIG. 5 is a functional block diagram illustrating the connection of components used to generate the AC test signal and measure the resulting AC voltage magnitude within the field device.

FIG. 5 illustrates a functional block diagram of an embodiment in which the components necessary to detect fluid in terminal block area 17 are located locally within field device 10 (in contrast with the embodiment discussed with respect to FIG. 4, in which the resulting AC voltage magnitude was measured within control room 32). The components include terminal block 17, terminals 18a and 18b, current regulation circuit 30, AC coupled measurement device 42, and power supply 44.

As discussed with respect to FIG. 4, control room 32 provides approximately 20-25 volts between terminals 18a and 18b. Power supply 44 is connected between terminals 18a and 18b and uses the 20-25 volts provided by control room 32 to provide regulated power (labeled as PWR) to devices and components located within field device 10 (for example, microprocessor 26, current regulator circuit 30, and AC coupled measurement device 42).

Current regulator circuit 30 is connected to receive input from microprocessor 26, and to regulate the current provided to terminals 18a and 18b (as described with respect to FIG. 3). As discussed with respect to FIG. 3, the input received from microprocessor 26 may include a signal representative of a sensed processor variable as well as a digital signal. In the present invention, microprocessor 26 may periodically instruct current regulator circuit 30 to generate an AC test signal at a determined frequency to determine whether fluid is present in the terminal block. In the alternative, field device 10 may receive a request from control room 32 instructing field device 10 to generate an AC test signal and measure the resulting AC voltage magnitude.

AC coupled measurement device 42 is connected to monitor the AC voltage magnitude generated in response to an AC test signal generated by current regulator circuit 30. In one embodiment, AC coupled measuring device is incorporated onto the same application specific integrated circuit (ASIC) as current regulation circuit 30.

As shown in FIG. 5, AC coupled measurement device 42 is electrically connected between terminals 18a and 18b. AC measurement device 42 may include a measurement resistor (not shown) and an AC coupled measuring device (not shown). The resulting AC voltage magnitude generated across the measurement resistor in response to the AC test signal is measured by the AC coupled measuring device.

As shown in FIG. 5, AC coupled measurement device 42 is also connected to provide the measured AC voltage magnitude to microprocessor 26, which can either store the measured value locally or communicate the measured value digitally to control room 32 via current regulation circuit 30. Additionally, microprocessor 26 may determine based on the measured AC voltage magnitude whether to initiate an alarm or notification to control room 32 indicating the presence of fluid detected in terminal block 17. The determination may be made based on previous AC voltage magnitudes measured with respect to an AC test signal, or may be based on some preprogrammed threshold level that microprocessor 26 uses to determine whether fluid is present in the terminal block.

Figure 6:
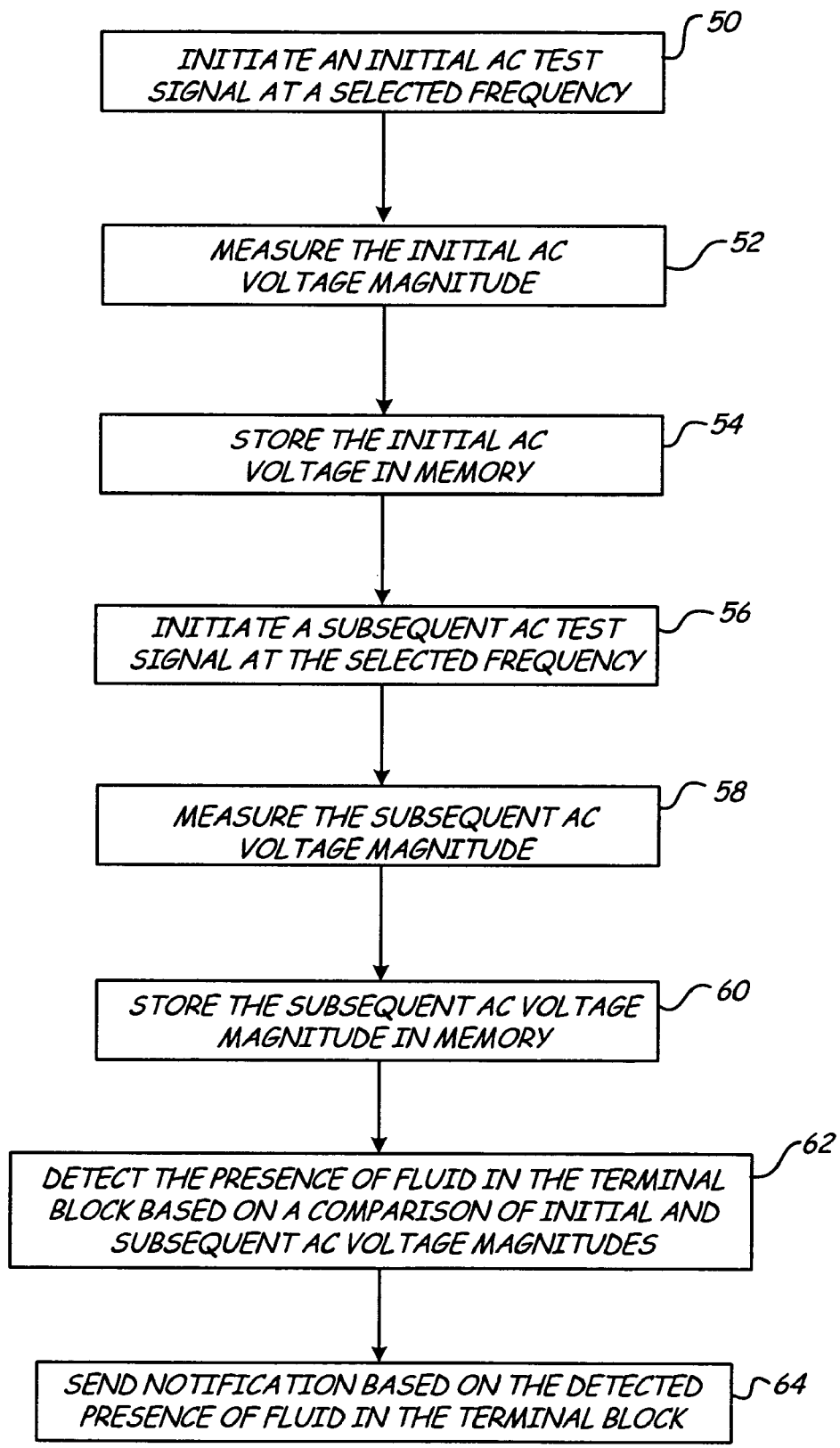
FIG. 6 is a flow chart illustrating a method of detecting fluid in the terminal block of the field device.

FIG. 6 is a flowchart of one method used to detect fluid in terminal block area 17 of field device 10. At step 50, an initial AC test signal is initiated at a selected frequency. The initial test signal may be initiated at the request of control room 32, or may be done automatically upon installation of field device 10 (i.e., when no fluid is present in terminal block 17).

At step 52, an initial AC voltage magnitude is measured in response to the initial AC test signal. As discussed above, the AC voltage magnitude measurement may be made either internally within field device 10 (as shown in FIG. 5) or in control room 32 (as shown in FIG. 4).

At step 54, the initial AC voltage magnitude is stored to memory. In one embodiment, the initial AC voltage magnitude measured locally within field device 10 is communicated to microprocessor 26, which stores the measured initial AC voltage magnitude locally. In another embodiment, microprocessor 26 instructs communication chipset 28 to communicate the measured AC voltage magnitude to control room 32, which proceeds to store the measured value to memory located within control room 32. If the AC voltage magnitude measurement is made by control room 32, then control room 32 stores the measured value to memory located within control room 32.

At step 56, a subsequent AC test signal is initiated at the same frequency as the initial AC test signal. Once again, the subsequent AC test signal may be initiated at the request of control room 32, or may be initiated internally by field device 10. For example, field device 10 may periodically initiate a subsequent AC test signal to determine whether fluid is present in terminal block 17.

At step 58, a subsequent AC voltage magnitude is measured in response to the subsequent AC test signal. The subsequently measured AC voltage magnitude may be measured either locally by field device 10 (as shown in FIG. 5) or at control room 32 (as shown in FIG. 4).

At step 60, the subsequently measured AC voltage magnitude is stored to memory. The subsequently measured AC voltage magnitude may be stored locally within memory located within field device 10, or may be communicated via communication chipset 28 to control room 32.

At step 62, the presence of fluid in terminal block area 17 is detected by comparing the initial AC voltage magnitude (representing a situation in which no fluid is present in terminal block area 17) with the subsequently measured AC voltage magnitude. The subsequently measured AC voltage magnitude may be compared directly to the initial AC voltage magnitude, or may be compared to a threshold value determined based on the initial voltage magnitude.

At step 64, based on the determination made at step 62, a notification or alarm regarding the presence of fluid in the terminal block area of field device 10 is generated. If the determination was made within field device 10, then the notification is communicated to control room 32 using the digital communication capabilities of field device 10.

The method described with respect to FIG. 6 is one method of detecting the presence of fluid in the terminal block 17 of field device 10. In another embodiment, rather than generating an initial AC test signal and measuring the resulting AC voltage magnitude, a customer characterizes the impedance of the current loop upon initialization of the system, and defines a threshold AC voltage value that is used to detect the presence of fluid in terminal block area 12. After field device 10 is installed and operational, a command from control room 32 causes field device 10 to generate an AC test signal at a particular frequency and to measure the resulting AC voltage amplitude (either within control room 32 or locally within field device 10). If the measured AC voltage amplitude drops below the selected threshold value, then a determination is made that fluid is present within terminal block 17 of field device 10. Based on the determination, a notification is communicated to control room 32.

Although the present invention has been described with reference to preferred embodiments, workers skilled in the art will recognize that changes may be made in form and detail without departing from the spirit and scope of the invention. For instance, the location of the measured AC voltage magnitude may be conducted at control room 24, at a handheld device, or within field device 10. The AC voltage magnitude provides insight into impedance changes to field device 10, regardless of the location of the measurement of the AC voltage magnitude. Likewise, in other embodiments the AC test signal is not generated by current regulation circuit 30, but is generated independently either internally within field device 10 or external to field device 10.

The invention claimed is:

1. A method of detecting fluid in a terminal block of a field device, the method comprising:
    measuring an initial impedance of a current loop connecting the field device to a control room when no fluid is present in the terminal block of the field device, wherein the current loop is connected to the field device by first and second terminals located in the terminal block of the field device;
    selecting a threshold AC voltage magnitude value based on the measured initial impedance of the current loop in which no fluid is present in the terminal block;
    applying an alternating current (AC) test signal at a selected frequency to the current loop;
    measuring a resulting AC voltage magnitude in response to the AC test signal; and
    detecting a change in impedance of the current loop by comparing the AC voltage magnitude measured in response to the AC test signal to the threshold AC voltage magnitude selected based on the initial impedance of the current loop, wherein a detected change in the impedance of the current loop indicates the presence of fluid in the terminal block between the first and second terminals.

2. The method of claim 1, wherein applying the AC test signal at the selected frequency to the current loop includes:
    modulating the current provided to the current loop at the selected frequency using digital communication capabilities of the field device.

3. The method of claim 1, further including:
    notifying the control room connected to the field device of the presence of fluid in the terminal block area of the field device.

4. The method of claim 1, wherein measuring the resulting AC voltage amplitude includes:
    using a hand-held device connected to the first and second terminals of the field device.

5. A method of detecting fluid in a terminal block of a field device, the method comprising:
    applying an initial AC test signal at a selected frequency to a current loop that connects the field device to a control room, wherein the two-wire current loop is connected to the field device by first and second terminals located in the terminal block of the field device -and the initial AC test signal is provided when no fluid is present within the terminal block;
    measuring an initial AC voltage magnitude in response to the initial AC test signal;
    applying a subsequent AC test signal at the selected frequency to the current loop;
    measuring a subsequent AC voltage magnitude generated in response to the subsequent AC test signal; and
    detecting a change in impedance of the current loop by comparing the initial AC voltage magnitude with the subsequent AC voltage magnitude, wherein a detected change in the impedance of the current loop indicates the presence of fluid in the terminal block between the first and second terminals.

6. The method of claim 5, further including:
    storing the initial AC voltage magnitude measured in response to the initial AC test signal to memory located within the field device;
    storing the subsequent AC voltage magnitude measured in response to the subsequent AC test signal to the memory located within the field device, wherein the initial AC voltage magnitude and the subsequent AC voltage magnitude measured in response to the subsequent AC test signal are made available to a microprocessor for determining whether fluid is present in the terminal block.

7. The method of claim 5, further including:
    communicating the initial AC voltage magnitude measured in response to the initial AC test signal to the control room;
    communicating the subsequent AC voltage magnitude measured in response to the subsequent AC test signal to the control room, wherein the control room determines whether fluid is present in the terminal block based on the initial AC voltage magnitude and the subsequent AC voltage magnitude.

8. The method of claim 5, further including:
    notifying a control room connected to the field device of the presence of fluid in the terminal block area of the field device.

9. The method of claim 5, wherein measuring the resulting AC voltage amplitude includes:
    using a hand-held device connected to the first and second terminals of the field device.

10. A field device which detects fluid within a terminal block area of the field device, the field device comprising:
    a terminal block area;
    a first terminal and a second terminal enclosed within the terminal block area of the field device, wherein the field device receives power and communicates with a control room by way of a two-wire pair that is connected to the first terminal and the second terminal, respectively, to form a current loop, wherein an accumulation of fluid within the terminal block causes fluid to come into contact with the first terminal and the second terminal;
    a sensor device for sensing a process variable;

a current regulation circuit connected between the first terminal and the second terminal for communicating the sensed process variable over the current loop to the control and for generating on the current loop an alternating current (AC) test signal at a selected frequency; and an AC measurement device connected to measure a resulting AC voltage magnitude generated in response to the AC test signal provided by the current regulation circuit, wherein the presence of fluid within the terminal block area, characterized by a change in impedance of the current loop caused by the presence of fluid between the first terminal and the second terminal, is detected based on the measured AC voltage magnitude.

11. The field device of claim 10, wherein the AC measurement device includes:

a resistive element; and an AC coupled receiving device connected across the resistive element to measure the resulting AC voltage magnitude.

12. The field device of claim 10, further including:

a microprocessor connected to receive input from the AC measurement device regarding the measured AC voltage magnitude, wherein the microprocessor determines whether fluid is present in the terminal block based on the measured AC voltage magnitude.

13. The field device of claim 12, wherein the microprocessor determines whether fluid is present in the terminal block by comparing an initial AC voltage magnitude measured in response to an initial AC test signal generated on the current loop and characterized by a first impedance in which no fluid is present between the first and second terminals to a subsequent AC voltage magnitude measured in response to a subsequent AC test signal.

14. The field device of claim 12, wherein the microprocessor determines whether fluid is present in the terminal block by comparing the resulting AC voltage magnitude measured in response to the AC test signal to a threshold AC voltage magnitude selected based on an initial impedance associated with the current loop upon initialization of the system.

15. A system for detecting the presence of fluid in a terminal block area of a field device, the system comprising:

a terminal block area;

a first terminal and a second terminal enclosed within the terminal block area of the field device, wherein the field device receives power and communicates with a control room by way of a two-wire pair that is connected to the first terminal and the second terminal, respectively, to form a current loop, wherein the accumulation of fluid within the terminal block causes fluid to come into contact with the first terminal and the second terminal;

means for applying an alternating current (AC) test signal at a selected frequency to the current loop;

means for measuring a resulting AC voltage magnitude in response to the AC test signal; and means for detecting the presence of fluid in the terminal block, characterized by a change in impedance of the current loop caused by the presence of fluid between the first terminal and the second terminal, that is detected based on the measured AC voltage magnitude.

16. The system of claim 15, wherein the means for applying the AC test signal between the first and second terminals includes:

a current regulation circuit located within the field device that modulates the current provided to the current loop at the selected frequency using digital communication capabilities of the field device.

17. The system of claim 15, wherein the means for applying an AC test signal and the means for measuring a resulting AC voltage magnitude are located on a communication chipset within the field device.

18. The system of claim 15, wherein the means for measuring a resulting AC voltage magnitude includes:

a measurement resistor connected to receive the AC test signal generated by the means for applying an AC test signal; and an AC coupled measurement device for measuring the AC voltage magnitude generated across the measurement resistor.

19. The system of claim 15, wherein the means for detecting the presence of fluid in the terminal block compares the AC voltage magnitude measured in response to the AC test signal to a threshold AC voltage magnitude selected based on the initial impedance of the current loop to detect a change in impedance associated with the current loop.

20. The system of claim 15, wherein the means for detecting the presence of fluid in the terminal block compares the AC voltage magnitude measured in response to the AC test signal to an initial AC voltage magnitude measured in response to an initial AC test signal to detect a change in impedance of the current loop.

21. The system of claim 20, further including:

means for storing the initial AC voltage magnitude measured in response to the initial AC test signal to memory located within the field device; and means for storing the AC voltage magnitude measured in response to the AC test signal to the memory located within the field device.

* * * * *